US010355671B1

(12) United States Patent
Mao

(10) Patent No.: US 10,355,671 B1
(45) Date of Patent: Jul. 16, 2019

(54) LOW POWER FLIP-FLOP CIRCIUT

(71) Applicant: Little Dragon IP Holding LLC, Saratoga, CA (US)

(72) Inventor: Mingming Mao, Saratoga, CA (US)

(73) Assignee: LITTLE DRAGON IP HOLDING LLC, Saratoga, CA (US)

( * ) Notice: Subject to any disclaimer, the term of this patent is extended or adjusted under 35 U.S.C. 154(b) by 0 days.

(21) Appl. No.: 15/996,821

(22) Filed: Jun. 4, 2018

(51) Int. Cl.
*H03K 3/012* (2006.01)
*H03K 3/037* (2006.01)

(52) U.S. Cl.
CPC .......... *H03K 3/012* (2013.01); *H03K 3/037* (2013.01)

(58) Field of Classification Search
CPC .... H03K 3/037; H03K 3/0372; H03K 3/0375; H03K 3/0377; H03K 3/012
USPC ........................................................ 327/211
See application file for complete search history.

(56) References Cited

U.S. PATENT DOCUMENTS

| | | | | |
|---|---|---|---|---|
| 4,843,254 A | * | 6/1989 | Motegi ............... | H03K 3/0372 326/97 |
| 5,936,449 A | * | 8/1999 | Huang ................ | G11C 7/1051 326/94 |
| 6,255,867 B1 | * | 7/2001 | Chen ............... | H03K 19/00361 327/108 |
| 2016/0006348 A1 | * | 1/2016 | Ho ........................ | G11C 16/30 327/536 |

\* cited by examiner

*Primary Examiner* — Patrick C Chen
(74) *Attorney, Agent, or Firm* — Getech Law LLC; Jun Ye

(57) ABSTRACT

Aspects for a flip-flop circuit are described herein. As an example, the aspects may include a first passgate, a first latch, a second passgate, and a second latch. The first latch may include a first inverter and a first logic gate. The first logic gate may further include a second inverter and at least one voltage reducing component. The voltage reducing component may be an N-channel transistor or a P-channel transistor. Similarly, the second latch may include a third inverter and a second logic gate. The second logic gate may further include a fourth inverter and at least one voltage reducing component.

11 Claims, 8 Drawing Sheets

LOW POWER FLIP-FLOP CIRCIUT

BACKGROUND

Flip-flops may refer to sequential circuits that store either a "high" value (power high or logic one) or a "low" value (power low or logic zero). A flip-flop may store a next value that depends on the values of one or more input signals. Conventionally, a flip-flop may include data, clock, set, and/or reset input signals.

A Data (conventionally designated D) input signal is typically clocked into the flip-flop on receipt of a given clock edge and appears at the flip-flop output on the opposite clock edge. Set (conventionally designated S) and Reset (conventionally designated R) input signals are generally unclocked, meaning that when the set or reset signal becomes active (e.g., goes high), the stored value changes immediately, without waiting for the arrival of a clock edge. An active set signal forces the stored value (conventionally designated Q) high, despite the previously stored value. An active reset signal forces the stored value Q low, despite the previously stored value. In set/reset flip-flops (i.e., flip-flops having both set and reset input signals) the set and reset signals are typically restricted such that at most one of them can be active at any given time. Since flip-flop is a fundamental building block of modern digital designs, there is always a need to minimize its power consumption and area. A new flop-flop design is proposed that would reduce its power consumption and area compared to conventional designs.

SUMMARY

The following presents a simplified summary of one or more aspects in order to provide a basic understanding of such aspects. This summary is not an extensive overview of all contemplated aspects and is intended to neither identify key or critical elements of all aspects nor delineate the scope of any or all aspects. Its sole purpose is to present some concepts of one or more aspects in a simplified form as a prelude to the more detailed description that is presented later.

The present disclosure presents examples of flip-flop circuits. An example flip-flop circuit may include a flip-flop data input terminal and a flip-flop output terminal; a first clock terminal that provides a first clock signal and a second clock terminal that provides a second clock signal, wherein the second clock signal is an inverse of the first clock signal; a first passgate coupled between the flip-flop data input terminal and a first node, wherein the first passgate include a first P-channel gate terminal and a first N-channel gate terminal, and the first P-channel gate terminal and the first N-channel gate terminal are respectively connected to the first clock terminal and to the second clock terminal; a first latch coupled between the first node and a second node, wherein the first latch includes a first logic gate having a first input terminal coupled to the first node and a first output terminal coupled to the second node, and a second logic gate having a second input terminal coupled to the second node and a second output terminal coupled to the first node, and wherein the second logic gate includes at least one first voltage reducing component and a first inverter; a second passgate coupled between the second node and a third node, wherein the second passgate includes a second P-channel gate terminal and a second N-channel terminal, and the second P-channel gate terminal and the second N-channel terminal are respectively connected to the first clock terminal and the second clock terminal; a second latch coupled between the third node and the flip-flop output terminal, wherein the second latch includes a third logic gate having a third input terminal coupled to the third node and a third output terminal coupled to the flip-flop output terminal, and a fourth logic gate having a fourth input terminal coupled to the flip-flop output terminal and a fourth output terminal coupled to the third node, and wherein the fourth logic gate includes at least one second voltage reducing component and a second inverter.

To the accomplishment of the foregoing and related ends, the one or more aspects comprise the features herein after fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Various aspects are now described with reference to the drawings. In the following description, for purpose of explanation, numerous specific details are set forth in order to provide a thorough understanding of one or more aspects. It may be evident, however, that such aspect(s) may be practiced without these specific details.

Figure 1:
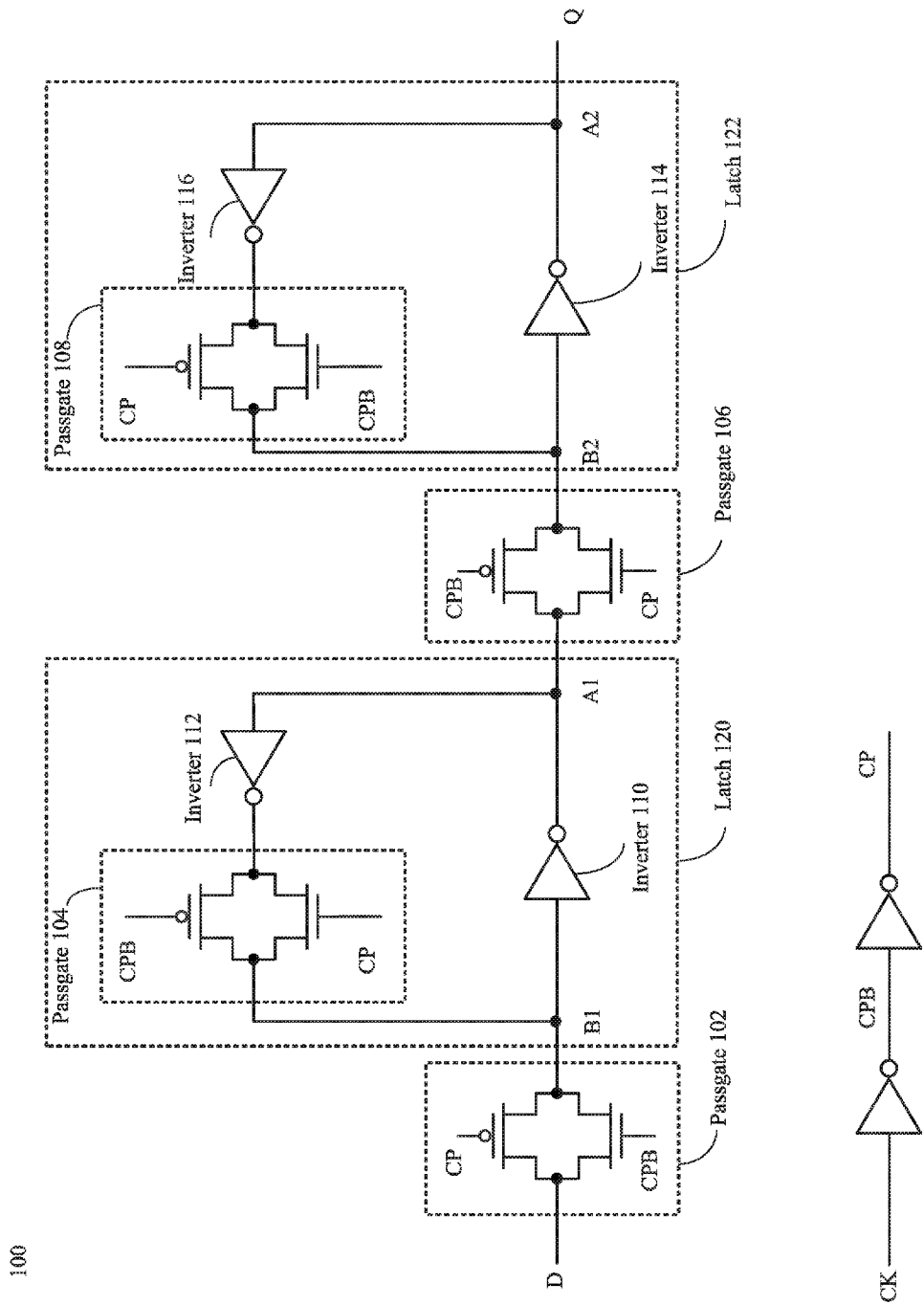
FIG. 1 is a block diagram illustrating a conventional flip-flop circuit.

Flip-flop circuits may be designed to include two latches separated by passgates. For example, FIG. 1 shows a conventional flip-flop circuit 100 that include a passgate 102, a latch 120, a passgate 106, and a latch 122, which are sequentially coupled together. A passgate may also be referred to as a pass gate or a transmission gate. In accordance with the signal coupled to the N-channel terminal and the P-channel of the passgate, the passgate may be either in a closed state (may also be referred to as "connected state") or an open state. For example, the passgate 102 of the flip-flop circuit 100 is coupled between a data input terminal (shown as "D" in FIG. 1) and the latch 120. Another passgate 106 is coupled between the latch 120 and the latch 122. The latch 120 includes a pair of cross-coupled inverters 110 and 112 and a passgate 104 coupled to the inverter 112 in the feedback. Similar to the latch 120, the latch 122 includes another pair of cross-coupled inverters 114 and 116 and a passgate 108 coupled to the inverter 116. As shown in FIG. 1, the clock signal CK is inverted to generate inverted clock signal CPB that is provided to respective N-channel terminals of the passgates 102, 104, 106, and 108. The inverted clock signal CPB may be further inverted to generate clock pulse CP. The clock pulse CP may be provided to the respective P-channel terminals of the passgates 102, 104, 106, and 108.

Figure 2:
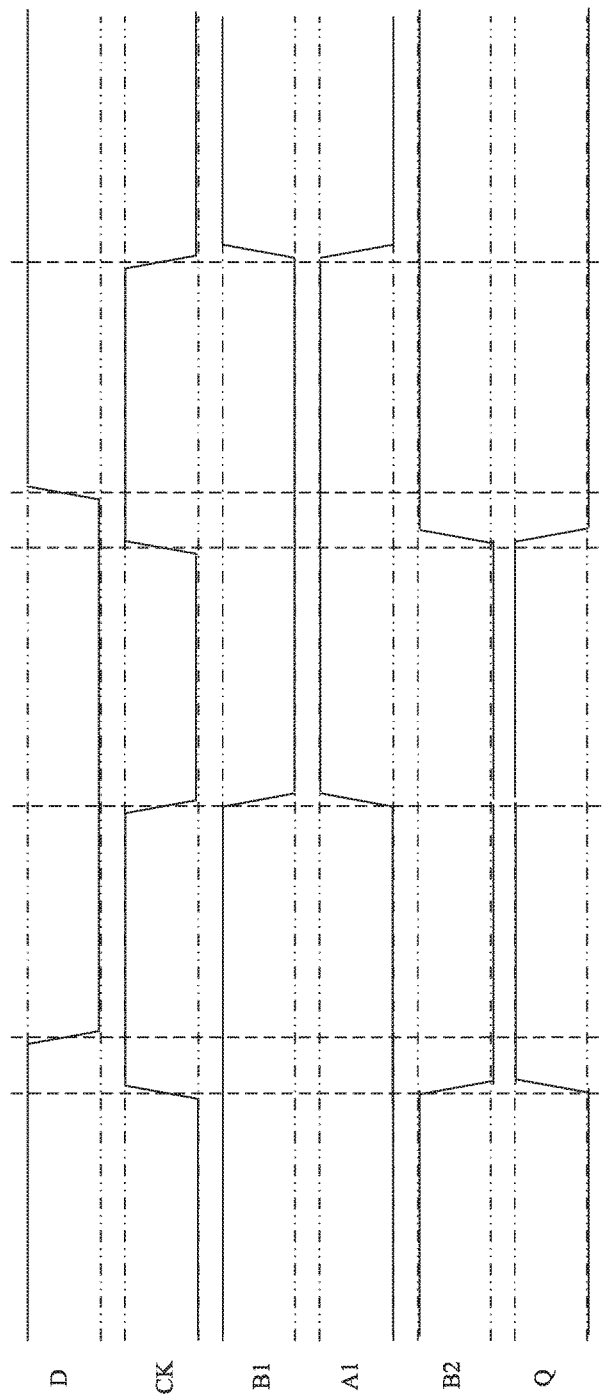
FIG. 2 is a timing diagram illustrating signals of the conventional flip-flop circuit of FIG. 1 in the time domain.

FIG. 2 shows a timing diagram illustrating signals of the conventional flip-flop circuit of FIG. 1 in the time domain. When CK is low, CPB is high and the passgate 102 is a closed state, meaning signals input from the data input terminal may pass through the passgate 102 to node B1. The data value at B1 is inverted by the inverter 110 and appears at the node A1. Thus, the data value at B1 is high and the data value at A1 is low. At the rising edge of CK, the passgate 102 is changed to an open state and the passgate 106 is in a closed state. Thus, the data value at node A1 is low and the data value at B2 is changed to be equal to the voltage at node A1, falling from high to low as shown FIG. 1. The passgate 104 is also changed to closed state to form a feedback loop to maintain the data value at B1. Meanwhile, the data value at node B2 is inverted and, thus, the data value at A2 and Q rises from low to high.

As shown, the conventional flip-flop circuit of FIG. 1 may function properly to generate correct signals. However, the passgates 104 and 108 and the inverters 112 and 116 may cause high power consumption. The extra power consumption comes from additional loading on the clock distribution network by the passgate and the logic operation of the inverter. Thus, another conventional flip-flop circuit without the feedback structure was proposed.

Figure 3:
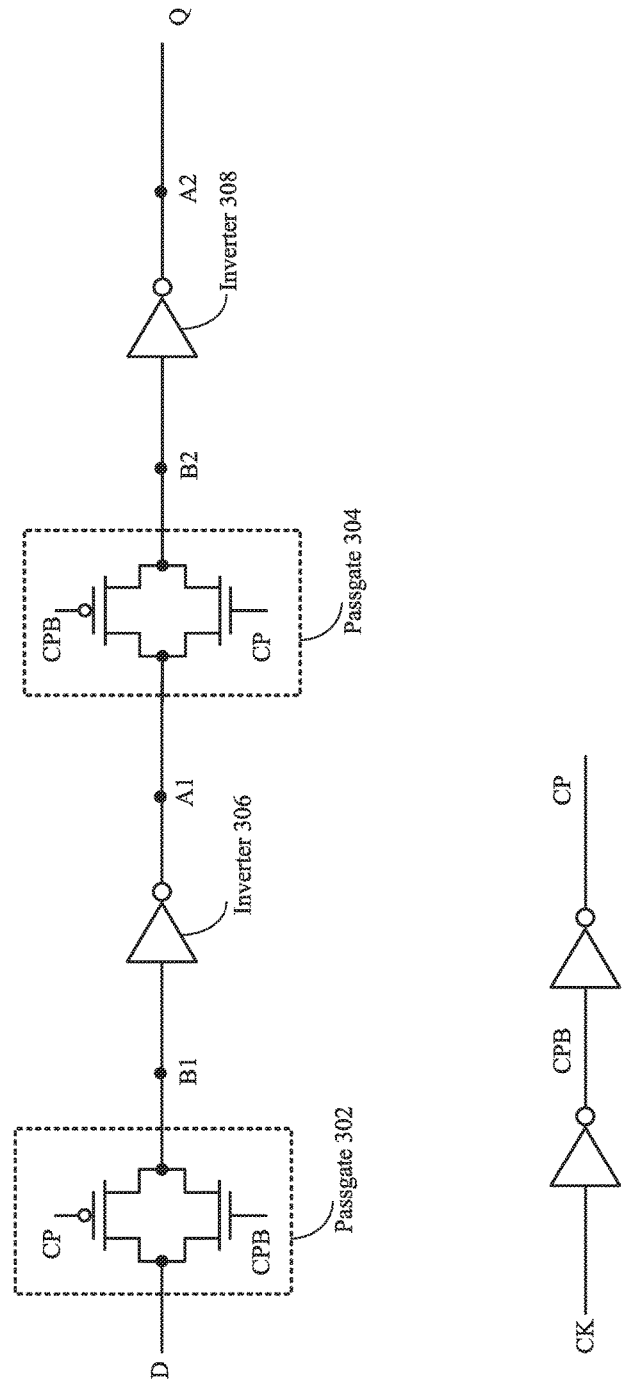
FIG. 3 is a block diagram illustrating another conventional flip-flop circuit.

FIG. 3 shows a block diagram illustrating another conventional flip-flop circuit without the feedback structure.

As shown, the conventional flip-flop circuit 300 may include a passgate 302, an inverter 306, a passgate 304, and an inverter 308, sequentially connected together. Similar to clock signals provided to the flip-flop circuit 100, the clock pulse (CP) and the inverted clock signals (CPB) are respectively provided to the P-channel terminals of the passgates 302 and 304 and to the N-channel terminals of the passgates 302 and 304. Without the feedback structure, power consumption of the flip-flop circuit 300 may be lower than the flip-flop circuit 100. However, the flip-flop circuit 300 may present some stability issues that will result in logic errors.

Figure 4A:
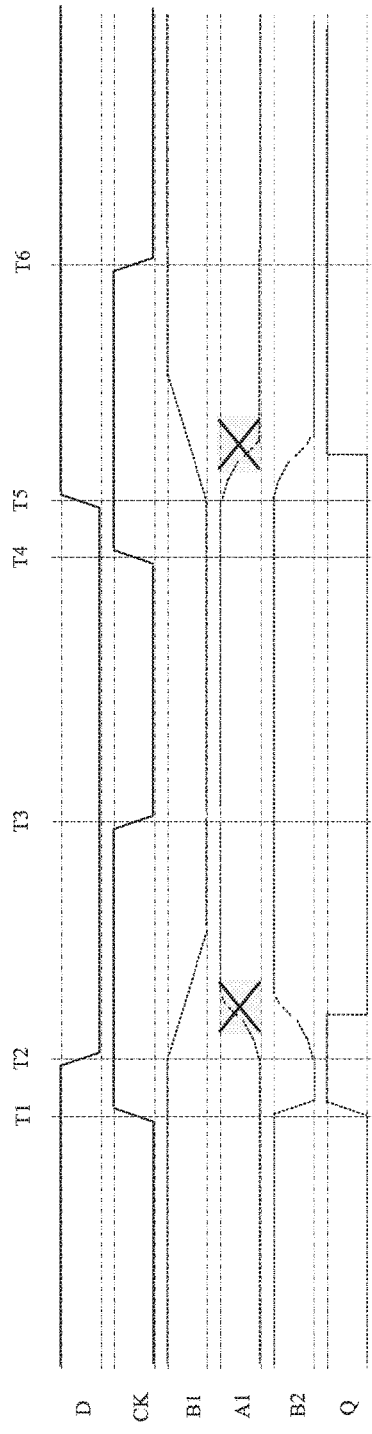
FIGS. 4A and 4B are timing diagrams illustrating signals of the conventional flip-flop circuit of FIG. 3 in the time domain.
Figure 4B:
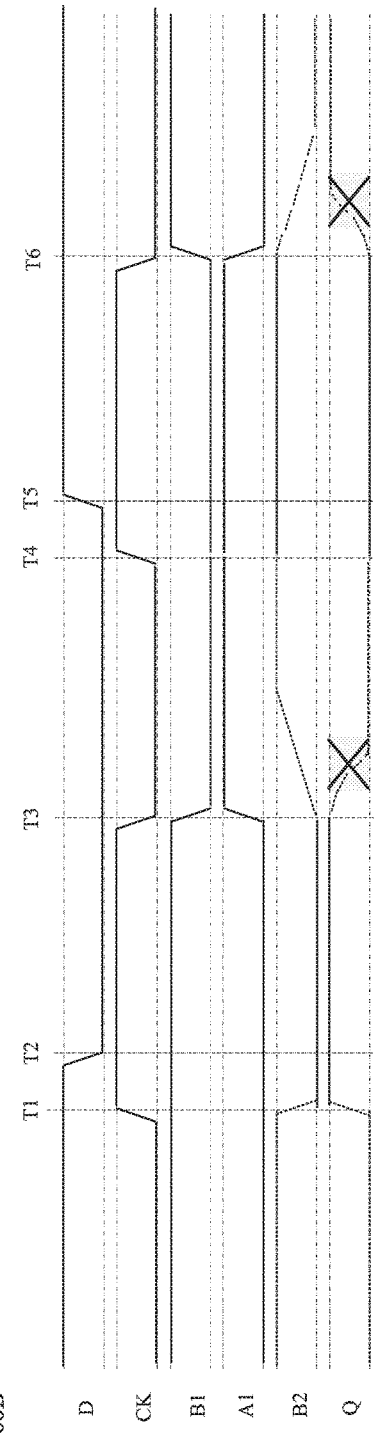

FIGS. 4A and 4B are timing diagrams illustrating signals of the conventional flip-flop circuit 300 of FIG. 3 in the time domain. FIG. 4A shows logic errors that occur at the node B1 and A1, which further leads errors at nodes B2 and A2. FIG. 4B shows logic errors that may occur at B2 and A2.

In more detail, when the clock signal is low, the passgate 302 is in closed state. Thus, the data value at B1 equals the data value at the data input terminal. For example, the data value at B1 maintains the same value as the data value (i.e., high) at D prior to time point T1. At the rising edge of clock signal at time point T1, the passgate 302 changes to an open state. When the data value at the data input terminal D drops to low at time point T2, the data value at node B1 should have been maintained at high since the passgate 302 is now open. However, due to the leakage at passgate 302, the voltage at node B1 gradually drops to the same level as the voltage at the data input terminal D. The data value at node B1 is inverted and appears at node A1, causing the voltage at node A1 to rise to high. Because the passgate 304 is in closed state at time point T2, the data value at B2 will rise to high following the data value at node A1 and further be inverted to appear at node A2. The data value at node A2/Q, thus, drops to low.

Further, when the data value at the data input terminal D is low and the clock signal rises to high at time point T4, the passgate 302 is open. Since the data value at data input terminal D and the data value at node B1 are both low, no leakage at the passgate 302 occurs between time points T4 and T5. However, when the data value at the data input terminal D rises to high at time point T5, the leakage occurs and the data value at node B1 rises to high following the voltage at the data input terminal D. The data value at node B1 is inverted by the inverter 306 and, thus, the data value at terminal A1 drops to low. Similarly, the data value at node B2 drops to low and the data value at A2/Q rises to high. As shown, the logic errors may occur due to the leakage in the passgate 302.

Similar logic errors may also occur due to the leakage at the passgate 304, as shown in FIG. 4B. When the clock signal CK drops from high to low at time point T3, the passgate 302 is closed and the passgate 304 is in open state. The data value at node B2 should have been maintained at high. However, since the data value at node A1 rises to high at time point T3 and due to the leakage at the passgate 304, the data value at node B2 rises to high, following the data value at node A1. The data value at node B2 is further inverted by the inverter 306 causing the data value at A2/Q to drop from high to low.

Further, when the clock signal CK drops from high to low at time point T6, the passgate 304 is also in open state and the data value at B2 should have been maintained at high. However, when the data value at node A1 drops at time point T6, the data value at node B2 may also drop due to the leakage at the passgate 304. The data value at node B2 is further inverted by the inverter 306 causing the data value at A2/Q to rise from low to high.

Figure 5:
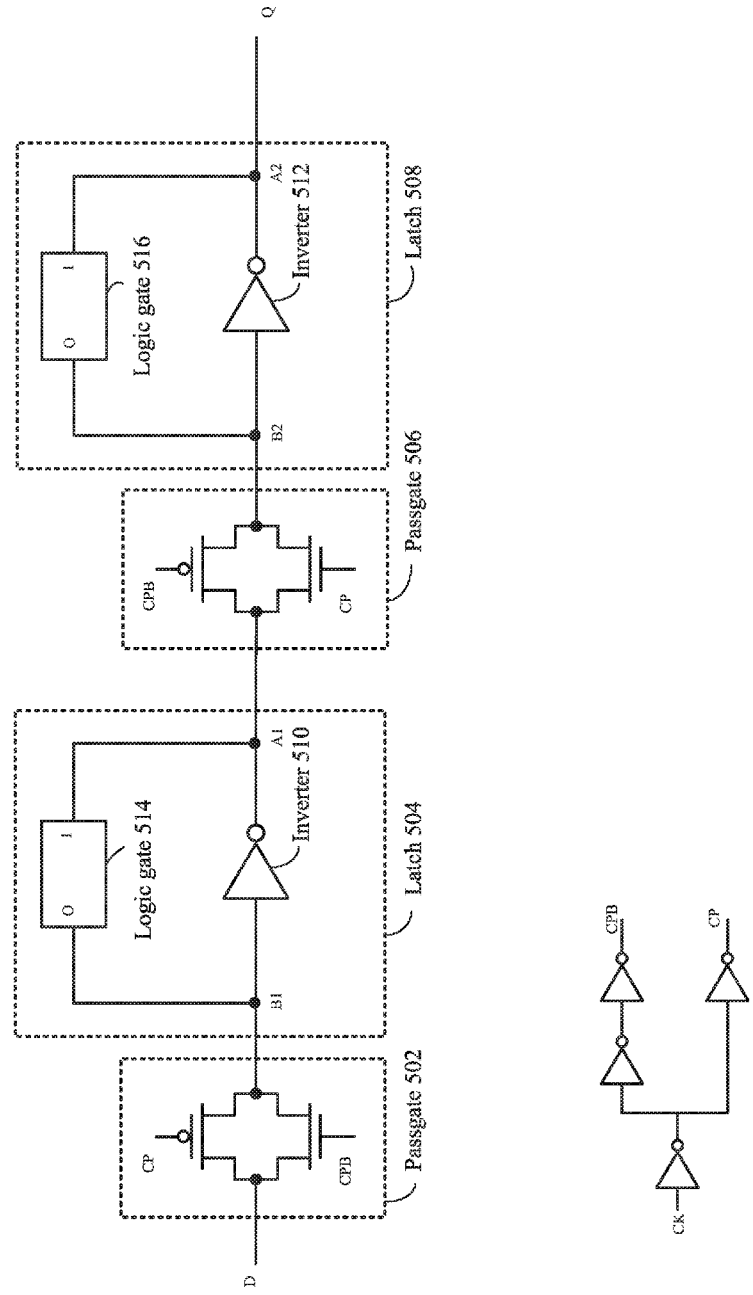
FIG. 5 is a block diagram illustrating an example flip-flop circuit in accordance with one embodiment of the invention.

FIG. 5 is a block diagram illustrating an example flip-flop circuit in accordance with one embodiment of the invention. As depicted, example flip-flop circuit 500 may include a passgate 502, a latch 504, a passgate 506, and a latch 508, sequentially connected together.

In more detail, the passgate 502 may be coupled between the data input terminal D and a first node ("node B1" hereinafter). The passgate 502 may include a P-channel transistor and an N-channel transistor respectively having a P-channel gate terminal and an N-channel gate terminal. In the example, the P-channel gate terminal of the passgate 502 may be coupled to clock pulse CP and the N-channel gate terminal of the passgate 502 may be coupled to inverted clock signal CPB. The source and drain terminals of the P-channel transistor and the N-channel transistor are respectively connected together.

The latch 504 may be coupled between the node B1 and a second node ("node A1" hereinafter). In the example, the latch 504 may include a first logic gate (e.g., an inverter 510) and a second logic gate (e.g., logic gate 514). The input terminal of the inverter 510 may be coupled to the node B1 and the output terminal of the inverter 510 may be coupled to node A1, whereas the input terminal of the logic gate 514 may be coupled to the node A1 and the output terminal of the logic gate 514 may be coupled to the node B1. As further described in accordance with FIG. 6, the logic gate 514 may further include at least one voltage reducing component and an inverter.

Further, the passgate 506 may be coupled between the node A1 and a third node ("node B2" hereinafter). Similar to the passgate 502, the passgate 506 may also include a P-channel transistor and an N-channel transistor respectively having a P-channel gate terminal and an N-channel gate terminal. Unlike the passgate 502, the P-channel gate terminal of the passgate 506 may be coupled to the inverted clock signal CPB and the N-channel gate terminal of the passgate 506 may be connected to clock pulse CP.

Further still, the latch 508 may be coupled between the node B2 and a fourth node ("node A2/Q" hereinafter). Similar to the latch 504, the latch 508 may include a third logic gate (e.g., an inverter 512) and a fourth logic gate (e.g., logic gate 516). The input terminal of the inverter 512 may be coupled to the node B2 and the output terminal of the inverter 512 may be coupled to the node A2/Q, whereas the input terminal of the logic gate 516 may be coupled to the node A2/Q and the output terminal of the logic gate 516 may be coupled to the node B2. Similar to the logic gate 514, the logic gate 516 may further include at least one voltage reducing component and an inverter as shown in FIG. 6.

Figure 6:
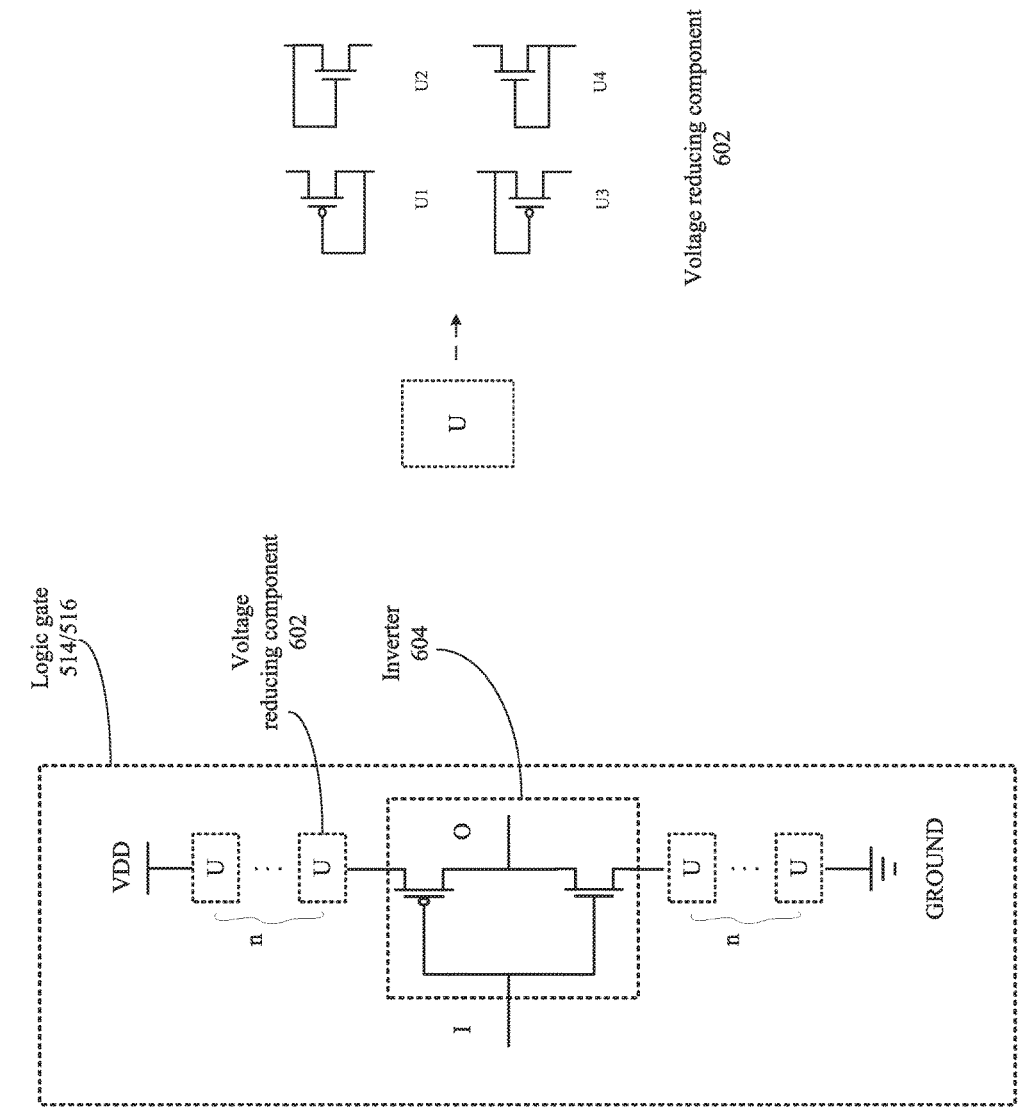
FIG. 6 is a block diagram illustrating one or more example components of the example flip-flop circuit in accordance with one embodiment of the invention.

FIG. 6 is a block diagram illustrating one or more example components of the example flip-flop circuit in accordance with one embodiment of the invention. As depicted, the logic gate 514/516 may include an inverter 604 and at least one voltage reducing component 602. Although multiple voltage reducing components 602 are shown in FIG. 6, one voltage reducing component 602 may be implemented in some embodiments.

The inverter 604 may include an N-channel transistor and a P-channel transistor, the gate terminals of which may be connected to form the input terminal of the logic gate 514/516. The drain terminals of the N-channel transistor and the P-channel transistor may be connected to form the output terminal of the logic gate 514/516. The unconnected source terminal of the P-channel transistor may be referred to as a voltage terminal of the inverter 604. The unconnected drain or source terminal of the N-channel transistor may be referred to as a ground terminal of the inverter 604.

As shown, at least one voltage reducing component 602 may be coupled between a supply terminal that is further coupled to an input high voltage value (e.g., a supply voltage "$V_{DD}$") and the voltage terminal of the inverter 604. Alternatively or additionally, at least one voltage reducing component 602 may be coupled between a ground point that is further coupled to a zero-voltage value and the ground terminal of the inverter 604.

As further illustrated in FIG. 6, each of the at least one voltage reducing component 602 may be implemented in a form of a P-channel transistor or an N-channel transistor (e.g., U1, U2, U3, and U4 in FIG. 6). The gate terminal of the P-channel or N-channel transistor may be connected to either the drain terminal or the source terminal thereof.

Figure 7:
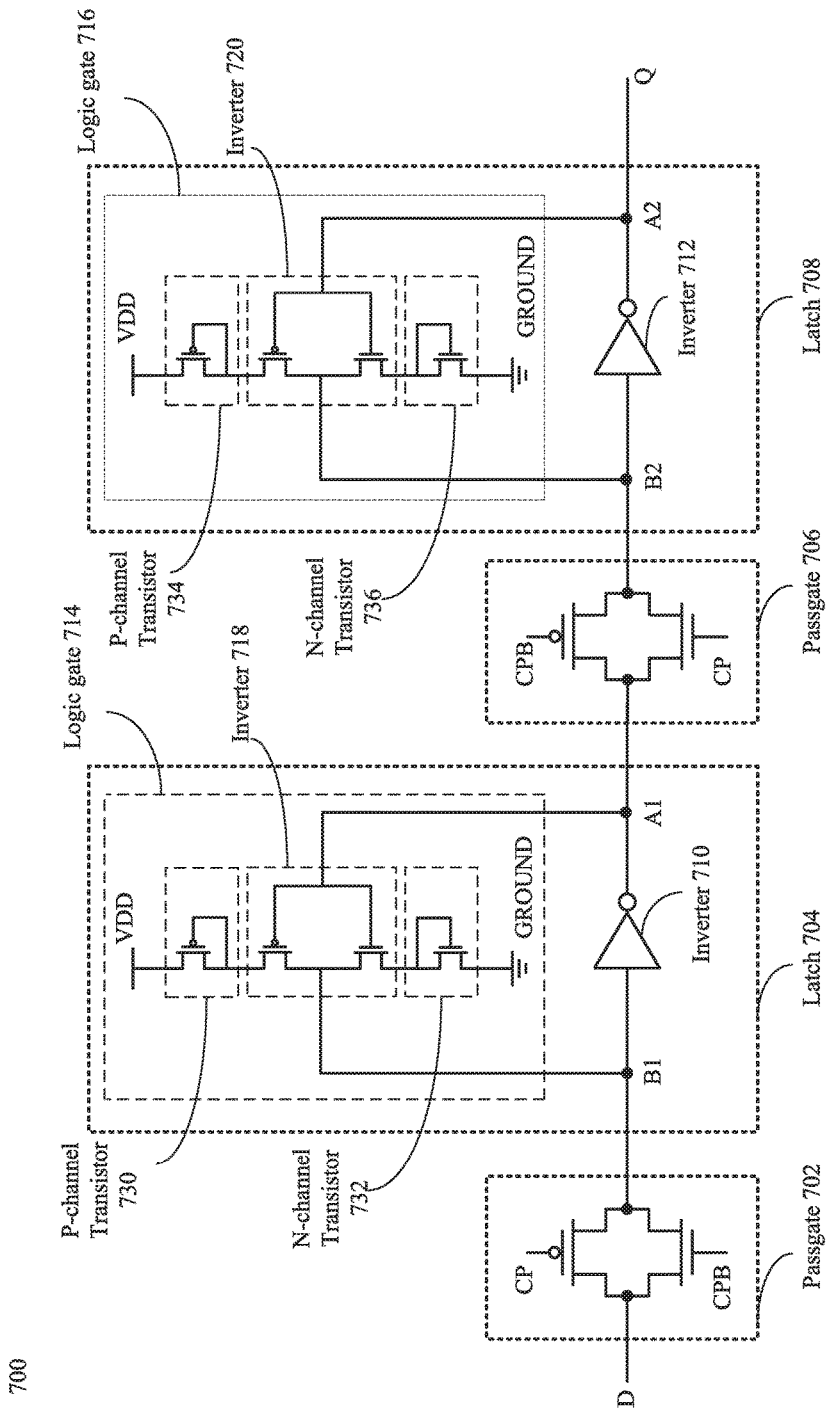
FIG. 7 is a block diagram illustrating another example flip-flop circuit in accordance with one embodiment of the invention.
Figure 7:
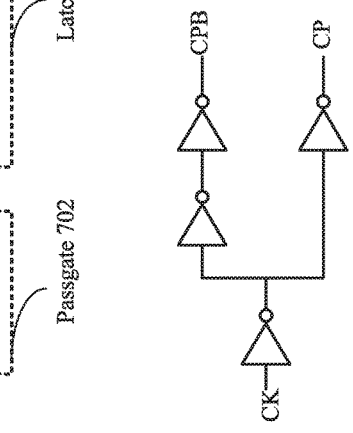

FIG. 7 is a block diagram illustrating another example flip-flop circuit in accordance with one embodiment of the invention. As depicted, each of the logic gates 714/716 in the example flip-flop circuit 700 may include a P-channel transistor and an N-channel transistor.

In more detail, the logic gate 714 may include an inverter 718, a P-channel transistor 730, and an N-channel transistor 732. The input terminal of the inverter 718 may be coupled to node A1 and the output terminal of the inverter 718 may be coupled to node B1.

The gate terminal of the P-channel transistor 730 may be connected either the drain terminal or the source terminal thereof. Similarly, the gate terminal of the N-channel transistor 732 may be connected to either the drain terminal or the source terminal thereof. The P-channel transistor 730 may be coupled between the $V_{DD}$ and the voltage terminal of the inverter 718 and the N-channel transistor 732 may be coupled between the ground point and the ground terminal of the inverter 718.

Similar to the logic gate 714, the logic gate 716 may include an inverter 720, a P-channel transistor 734, and an N-channel transistor 736. The input terminal of the inverter 720 may be coupled to node A2 and the output terminal of the inverter 720 may be coupled to node B2.

The gate terminal of the P-channel transistor 734 may be connected either the drain terminal or the source terminal thereof. Similarly, the gate terminal of the N-channel transistor 736 may be connected to either the drain terminal or the source terminal thereof. The P-channel transistor 734 may be coupled between the $V_{DD}$ and the voltage terminal of the inverter 720 and the N-channel transistor 736 may be coupled between the ground point and the ground terminal of the inverter 720.

Figure 8:
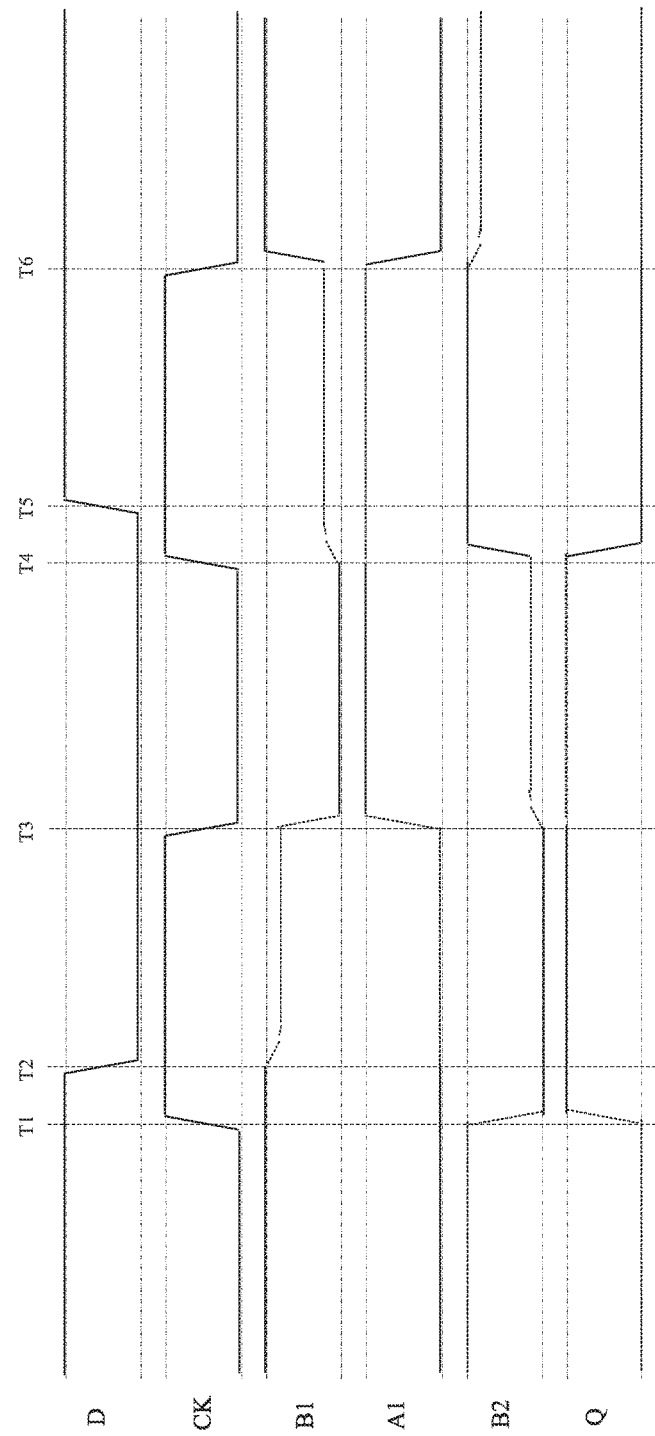
FIG. 8 is a timing diagram illustrating signals of the flip-flop circuit of FIG. 5 or FIG. 7 in the time domain.

FIG. 8 is a timing diagram illustrating signals of the example flip-flop circuit of FIG. 5 or FIG. 7 in the time domain.

Prior to time point T1, the data value at data input terminal D is high and the clock signal is low. As a result, the passgate 702 is in closed state and the data value at node B1 is high. At time point T1, the clock signal rises from low to high and, thus, the passgate 702 is in open state. The voltage at node B1 should remain the same till the clock signal CK falls from high to low, that is, the passgate 702 is in closed state again. However, when the data value at data input terminal D drops from high to low at time point T2 and due to the leakage at the passgate 702, the voltage would have dropped to low if no feedback structure provided in the latch 704. In this example, the leakage at the passgate 702 may still occur but the logic gate 714 may provide a high data value at node B1 to prevent the voltage at node B1 from dropping to low.

In more detail, because of the inclusion of the P-channel transistor 730 and the N-channel transistor 732, when the data value at node A1 is low, the N-channel transistor of the inverter 718 is equivalent to open state. In a non-limiting example, a threshold voltage value ("$V_T$" hereinafter) of the P-channel transistor 730/734 and the inverter 718/720 may normally be 0.28-0.3V. A typical supply voltage ("$V_{DD}$") may be 0.4V. Thus, when the $V_{DD}$ is not sufficient to meet the threshold voltages of the P-channel transistor 730 and the inverter 718 in combination (i.e., 0.4V<0.3V×2), the P-channel transistor 730 and the P-channel transistor within the inverter 718 may not turned on completely and will operate in the sub-threshold region. In this example, the P-channel transistor 730, the P-channel transistor in the inverter 718, and the passgate 702 may be considered as sequentially connected. As the resistance of the passgate 702 is normally much greater than the resistance of the two P-channel transistors in combination, the voltage at node B1 may be close to the supply voltage $V_{DD}$. Thus, the data value at node B1 may drop but still remain at high.

Further, when the clock signal CK drops from high to low at time point T3, the passgate 702 is now in close state; the data value at node B1 equals to the low input data value; the voltage at node A1 is high; the passgate 706 is in open state. The voltage would have risen to high due to the leakage at the passgate 706. Because of the inclusion of the P-channel transistor 734 and the N-channel transistor 736, the P-channel transistor of the inverter 720 is essentially in open state due to the high voltage at node A2/Q. Thus, the passgate 706, the N-channel transistor in the inverter 720, and the N-channel transistor 736 may be considered as sequentially connected. Similarly, because the resistance of the passgate 706 is normally much greater than the resistance of the two N-channel transistors in combination, the voltage at node B2 may be close to zero, i.e., voltage at the ground point. Thus, the data value at node B2 is prevented from rising to high at time point T3.

Comparing the example flip-flop circuit of FIG. 5 or FIG. 7 to the conventional flip-flop structure in FIG. 1, it would seem that the conventional structure may provide more stable output signals. However, the latch in the conventional structure (e.g., latch 120 or latch 122) needs to be broken because the feedback may be too strong and provide a voltage too high for writing a new value, whereas the passgate required to break the latch may be power consuming because it increases the clock tree loading.

Thus, the conventional structure in FIG. 1 may lead to higher overall power consumption than the example flip-flop circuit of FIG. 5 or FIG. 7 does.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described herein that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

I claim:

1. A flip-flop circuit, comprising:
   a flip-flop data input terminal and a flip-flop output terminal;
   a first clock terminal that provides a first clock signal and a second clock terminal that provides a second clock signal, wherein the second clock signal is an inverse of the first clock signal;
   a first passgate coupled between the flip-flop data input terminal and a first node, wherein
      the first passgate includes a first P-channel gate terminal and a first N-channel gate terminal, and
      the first P-channel gate terminal is connected to the first clock terminal and the first N-channel gate terminal is connected to the second clock terminal;
   a first latch coupled between the first node and a second node, wherein the first latch includes
      a first logic gate having a first input terminal coupled to the first node and a first output terminal coupled to the second node, and
      a second logic gate having a second input terminal coupled to the second node and a second output terminal coupled to the first node, and wherein
      the second logic gate includes at least one first voltage reducing component and a first inverter, wherein the at least first voltage reducing component includes a P-channel transistor and a gate terminal of the P-channel transistor is coupled to a source terminal or a drain terminal of the P-channel transistor;
   a second passgate coupled between the second node and a third node, wherein
      the second passgate includes a second P-channel gate terminal and a second N-channel terminal, and
      the second P-channel gate terminal is connected to the second clock terminal and the second N-channel terminal is connected to the first clock terminal;
   a second latch coupled between the third node and the flip-flop output terminal, wherein the second latch includes
      a third logic gate having a third input terminal coupled to the third node and a third output terminal coupled to the flip-flop output terminal, and
      a fourth logic gate having a fourth input terminal coupled to the flip-flop output terminal and a fourth output terminal coupled to the third node, and wherein
      the fourth logic gate includes at least one second voltage reducing component and a second inverter, wherein the at least one second voltage reducing component includes an N-channel transistor and a gate terminal of the N-channel transistor is coupled to one of a source terminal or a drain terminal of the N-channel transistor.

2. The flip-flop circuit of claim 1,
   wherein an input terminal of the first inverter is coupled to the second node, and
   wherein an output terminal of the first inverter is coupled to the first node.

3. The flip-flop circuit of claim 2, wherein the at least one first voltage reducing component is coupled between a supply terminal and a voltage terminal of the first inverter.

4. The flip-flop circuit of claim 2, wherein the at least one first voltage reducing component is coupled between a ground point and a ground terminal of the first inverter.

5. The flip-flop circuit of claim 1, wherein
   the at least one first voltage reducing component includes an N-channel transistor, and
   a gate terminal of the N-channel transistor is coupled to one of a source terminal or a drain terminal of the N-channel transistor.

6. The flip-flop circuit of claim 1, wherein the first logic gate is an inverter.

7. The flip-flop circuit of claim 1,
   wherein an input terminal of the second inverter is coupled to the flip-flop output terminal, and
   wherein an output terminal of the second inverter is coupled to the third node.

8. The flip-flop circuit of claim 7, wherein the at least one second voltage reducing component is coupled between a supply terminal and a voltage terminal of the second inverter.

9. The flip-flop circuit of claim 7, wherein the at least one second voltage reducing component is coupled between a ground point and a ground terminal of the second inverter.

10. The flip-flop circuit of claim 1, wherein
the at least one second voltage reducing component includes a P-channel transistor, and
a gate terminal of the P-channel transistor is coupled to one of a source terminal or a drain terminal of the P-channel transistor.

11. The flip-flop circuit of claim 1, wherein the third logic gate is an inverter.

* * * * *